(12) United States Patent
Wan et al.

(10) Patent No.: US 11,881,569 B2
(45) Date of Patent: Jan. 23, 2024

(54) BATTERY CASE SHORT-CIRCUIT PROCESSING METHOD AND SYSTEM

(71) Applicant: JIANGSU CONTEMPORARY AMPEREX TECHNOLOGY LIMITED, Changzhou (CN)

(72) Inventors: Yunxiao Wan, Changzhou (CN); Hao Wu, Changzhou (CN)

(73) Assignee: JIANGSU CONTEMPORARY AMPEREX TECHNOLOGY LIMITED, Changzhou (CN)

( * ) Notice: Subject to any disclaimer, the term of this patent is extended or adjusted under 35 U.S.C. 154(b) by 0 days.

(21) Appl. No.: 18/338,362

(22) Filed: Jun. 21, 2023

(65) Prior Publication Data

US 2023/0352754 A1 Nov. 2, 2023

Related U.S. Application Data

(63) Continuation of application No. PCT/CN2022/094500, filed on May 23, 2022.

(30) Foreign Application Priority Data

Oct. 25, 2021 (CN) .......................... 202111241532.0

(51) Int. Cl.
*H01M 10/48* (2006.01)
*H01M 50/691* (2021.01)
*H01M 10/42* (2006.01)

(52) U.S. Cl.
CPC ..... *H01M 10/482* (2013.01); *H01M 10/4207* (2013.01); *H01M 50/691* (2021.01)

(58) Field of Classification Search
CPC .......... H01M 10/482; H01M 10/4207; H01M 50/691
See application file for complete search history.

(56) References Cited

U.S. PATENT DOCUMENTS 5,989,743 A * 11/1999 Yamashita .......... H01M 50/572
429/170
2015/0364743 A1 12/2015 Shen et al.

FOREIGN PATENT DOCUMENTS

CN 103904355 A * 7/2014 ........ H01M 10/0413
CN 103904355 A 7/2014
(Continued)

OTHER PUBLICATIONS

Notice of Allowance received in the corresponding Japanese Application 2023-519112, dated Oct. 16, 2023.
(Continued)

*Primary Examiner* — Jimmy Vo
(74) *Attorney, Agent, or Firm* — Kilpatrick Townsend & Stockton LLP

(57) ABSTRACT

A battery case short-circuit processing method and system are provided. The battery case short-circuit processing method includes: when a short circuit between a case of a battery and a first electrode of the battery is detected, connecting the case and a second electrode of the battery by shorting, wherein if the first electrode is a positive electrode, the second electrode is a negative electrode; and if the first electrode is a negative electrode, the second electrode is a positive electrode; disconnecting the case of the battery from the second electrode, and carrying out standing of the battery for a preset duration; after the standing duration of the battery, detecting a potential difference between the case and the first electrode.

19 Claims, 5 Drawing Sheets

(56) References Cited

FOREIGN PATENT DOCUMENTS

| | | | |
|---|---|---|---|
| CN | 105514518 | A | 4/2016 |
| CN | 205542920 | U | 8/2016 |
| JP | 2004522939 | A | 7/2004 |
| JP | 2004319463 | A * | 11/2004 |
| JP | 2004319463 | A | 11/2004 |
| JP | 2008305752 | A | 12/2008 |
| JP | 2004319463 | A | 11/2014 |
| JP | 2015115232 | A | 6/2015 |
| KR | 1020100123598 | A | 11/2010 |
| KR | 1020110053004 | A | 5/2011 |
| WO | 2019189405 | A1 | 10/2019 |

OTHER PUBLICATIONS

International Search Report received in the corresponding International Application PCT/CN2022/094500, dated Aug. 8, 2022.
Written Opinion received in the corresponding International Application PCT/CN2022/094500, dated Aug. 8, 2022.
Notice of Allowance received in the corresponding Korean Application 10-2023-7009696, dated Dec. 1, 2023.

* cited by examiner

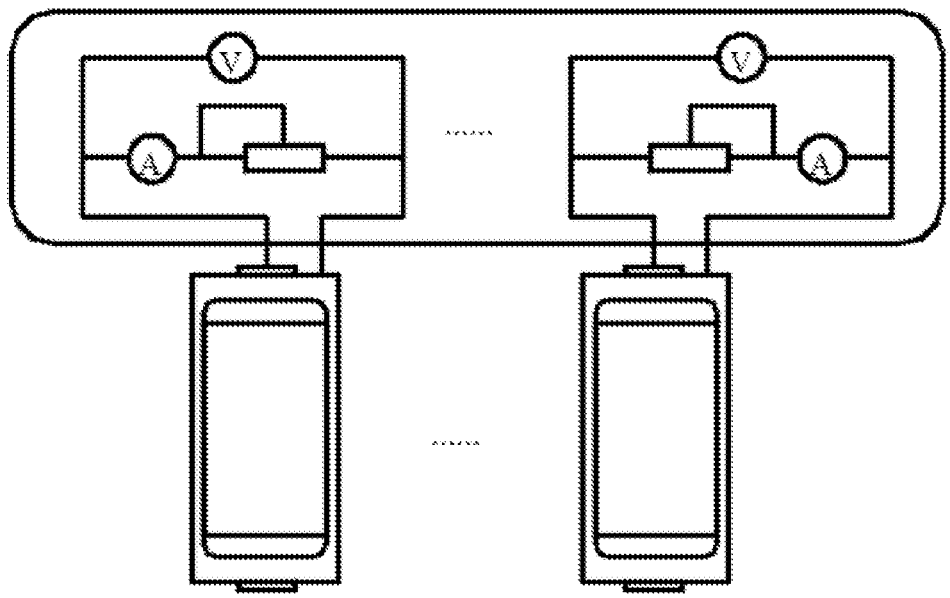

FIG. 3

S110: When a short circuit between a case of a battery and a first electrode of the battery is detected, connecting the case and a second electrode of the battery by shorting, wherein if the first electrode is a positive electrode, the second electrode is a negative electrode; and if the first electrode is a negative electrode, the second electrode is a positive electrode S100: Cleaning an electrolyte solution on the case before connecting the case and the second electrode by shorting S120: Disconnecting the case of the battery from the second electrode, and carrying out standing of the battery for a preset duration S130: After the standing duration of the battery, detecting a potential difference between the case and the first electrode S140: Determining, on the basis that the potential difference between the case and the first electrode is within a preset range, the type of the short circuit between the case and the first electrode and whether the short circuit is eliminated

FIG. 4

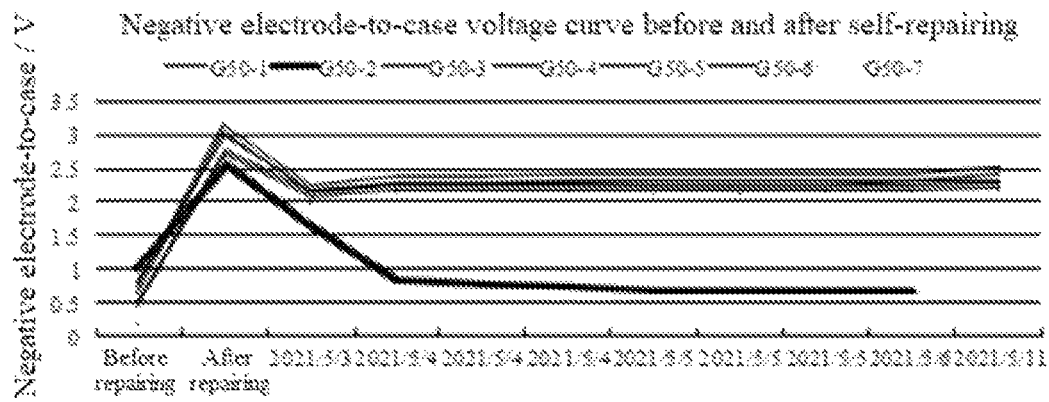
FIG. 7
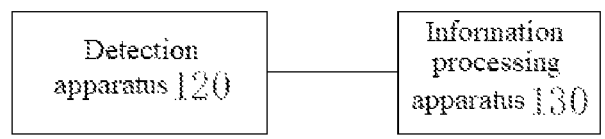
FIG. 8

… (1/2)

BATTERY CASE SHORT-CIRCUIT PROCESSING METHOD AND SYSTEM

CROSS-REFERENCE TO RELATED APPLICATIONS

The present application is a continuation of International Application PCT/CN2022/094500, filed May 23, 2022, which claims priority to Chinese patent application No. 2021112415320 filed on Oct. 25, 2021 and entitled "BATTERY CASE SHORT-CIRCUIT PROCESSING METHOD AND SYSTEM", which is incorporated herein by reference in its entirety.

TECHNICAL FIELD

The present application relates to the field of battery technologies, and in particular to, a battery case short-circuit processing method and system.

BACKGROUND ART

In recent years, the application scope of power batteries has become more extensive, for example, they have been widely used in energy storage power systems such as a hydroelectric power plant, a thermal power plant, a wind power plant, and a solar power plant, as well as power tools, military equipment, aerospace and other fields.

During assembling and testing of power batteries, cases of the batteries may be contaminated by electrolyte solutions, or there may be abnormal insulation between components that should be insulated, resulting in the problem such as short circuits of the cases of the batteries.

SUMMARY OF THE INVENTION

In view of the above problem, the present application provides a battery case short-circuit processing method and system, which can at least partially solve the problem of a short circuit of a case of a battery.

When a short circuit between a case of a battery and a first electrode of the battery is detected, connecting the case and a second electrode of the battery by shorting, wherein if the first electrode is a positive electrode, the second electrode is a negative electrode; and if the first electrode is a negative electrode, the second electrode is a positive electrode;

disconnecting the case of the battery from the second electrode, and carrying out standing of the battery for a preset duration;

after the standing duration of the battery, detecting a potential difference between the case and the first electrode; and determining, on the basis that the potential difference between the case and the first electrode is within a preset range, the type of the short circuit between the case and the first electrode and whether the short circuit is eliminated.

When it is found that the case of the battery is short-circuited with the first electrode, the case and the second electrode are connected by shorting to transfer a current between the case and the second electrode, so that the potential difference of the case relative to the first electrode returns to a normal value. By standing, when there is an internal short circuit of the case, a circumstance that the potential difference of the case relative to the first electrode is abnormal again due to the internal short circuit of the case within the standing duration may be eliminated. After the battery has been subjected to standing for the preset duration, the potential difference between the case and the first electrode is detected. If the potential difference is within the preset range, it means that the short circuit between the case and the first electrode is an external short circuit of the case and the external short circuit of the case has been repaired. If the potential difference is out of the preset range, the short circuit may be regarded as an internal short circuit of the case and cannot be repaired. On the one hand, the external short circuit of the case can be repaired by the shorting between the second electrode and the case and by the standing, and on the other hand, the unrepairable internal short circuit of the case can be eliminated, thereby reducing the safety problem caused by the battery having the internal short circuit of the case after it is put into use.

Based on the above solution, the determining, on the basis that the potential difference between the case and the first electrode is within a preset range, the type of the short circuit between the case and the first electrode and whether the short circuit is eliminated includes:

when the potential difference between the case and the first electrode is within the preset range, determining that the type of the short circuit between the case and the first electrode is an external short circuit of the case, and the external short circuit of the case is eliminated.

Based on the above solution, the determining, on the basis that the potential difference between the case and the first electrode is within a preset range, the type of the short circuit between the case and the first electrode and whether the short circuit is eliminated includes:

when the potential difference between the case and the first electrode is out of the preset range, determining that the type of the short circuit between the case and the first electrode is an internal short circuit of the case, and the internal short circuit of the case is not eliminated.

The determination of short-circuit types of the internal short circuit of the case and the external short circuit of the case as described above can be achieved simply by, after the second electrode and the case are connected by shorting and the battery is subjected to standing, measuring the potential difference between the case and the first electrode, and comparing to determine whether the measured potential difference is within the preset range.

Based on the above solution, the method further includes:

cleaning an electrolyte solution on the case before connecting the case and the second electrode by shorting.

Since the electrolyte solution is cleaned before the case and the second electrode are connected by shorting, after the external short circuit of the case is repaired, the electrolyte solution remaining on the case can transfer an external short circuit of the case that occurs again, thereby achieving a thorough repairing of the external short circuit of the case.

Based on the above solution, the cleaning an electrolyte solution on the case before connecting the case and the second electrode by shorting includes:

soaking the battery with an organic solvent of the electrolyte solution to dissolve the electrolyte solution on a surface of the case; and soaking the battery taken out from the organic solvent with a volatile alcohol substance to remove the organic solvent remaining on the surface of the case.

The electrolyte solution remaining on an outer surface of the case can be cleaned by the organic solvent of the electrolyte solution. Moreover, the battery is soaked with the volatile alcohol substance, the organic solvent remaining on the surface of the case of the battery and the electrolyte solution in the organic solvent can be dissipated by the volatile alcohol substance, so that the electrolyte solution on the outer surface of the battery can be removed more thoroughly.

Based on the above solution, a duration for soaking the battery in the organic solvent is a first duration;

and/or a duration for soaking the battery in the alcohol substance is a second duration.

In order to ensure thorough removing of the electrolyte solution on the outer surface of the case, durations for soaking the battery in the organic solvent and the alcohol substance are limited respectively.

Based on the above solution, the cleaning an electrolyte solution on the case before connecting the case and the second electrode by shorting includes:

before soaking the battery with the organic solvent, soaking the battery with deionized water at a preset temperature to dissolve crystals of the electrolyte solution on the surface of the case.

The battery is soaked with the deionized water at a high temperature, so that the crystals of the electrolyte solution on the surface of the case can be dissolved, and accordingly the outer surface of the case can be cleaned more thoroughly.

Based on the above solution, a duration for soaking the battery with the deionized water is a third duration.

In order to dissolve the crystals of the electrolyte solution on the outer surface of the case more thoroughly, the battery needs to be soaked in the deionized water for the third duration.

Based on the above solution, the preset temperature is between 70° C. and 90° C.

Under the preset temperature, it is ensured that the crystals are dissolved quickly and fully.

Based on the above solution, cleaning an electrolyte solution on the case before connecting the case and the second electrode by shorting includes:

emitting ultrasonic waves to the battery while the battery is soaked.

The case of the battery can be cleaned more thoroughly through microvibration caused by ultrasonic emission.

Based on the above solution, the organic solvent includes at least one of:

dimethyl carbonate;
diethyl carbonate; and
dipropyl carbonate;
and/or,
the alcohol substance includes:
anhydrous ethanol and/or anhydrous methanol.

Both the above-mentioned organic solvent and alcohol substance are featured by easy obtaining and low cost.

Based on the above solution, the method further includes:
sealing a terminal post of the second electrode of the battery before cleaning the electrolyte solution on the surface of the case.

Since the terminal post of the battery is sealed, corrosion of the terminal post when the battery is soaked can be reduced, thereby ensuring service life of the repaired battery.

Based on the above solution, the method further includes:
when it is detected that the potential difference between the case and the first electrode is out of the preset range, determining that there is a short circuit between the case and the first electrode.

By detecting the potential difference between the case and the first electrode, whether the case of the battery short-circuits can be detected easily and quickly.

Based on the above solution, the preset duration ranges from 6 to 54 hours.

The standing duration after the second electrode and the case of the battery are disconnected is the preset duration, so that an internal short circuit of the case occurs to cause discharging again, the internal short circuit of the case can be detected as much as possible, and the use of the battery having the internal short circuit of the case is avoided.

According to a second aspect, an embodiment of the present application provides a battery case short-circuit processing system, including:

a shorting member configured to, when a short circuit between a case of a battery and a first electrode of the battery is detected, connect the case and a second electrode of the battery by shorting, wherein if the first electrode is a positive electrode, the second electrode is a negative electrode; and if the first electrode is a negative electrode, the second electrode is a positive electrode;

a detection apparatus configured to detect a potential difference between the case and the first electrode after the case and the first electrode are disconnected and the battery is subjected to standing for the preset duration; and an information processing apparatus configured to determine, on the basis that the potential difference between the case and the first electrode is within a preset range, the type of the short circuit between the case and the first electrode and whether the short circuit is eliminated.

Based on the above solution, the information processing apparatus is specifically configured to determine, when the potential difference between the case and the first electrode is within the preset range, that the type of the short circuit between the case and the first electrode is an external short circuit of the case and the external short circuit of the case is eliminated.

The information processing apparatus is further configured to determine, when the potential difference between the case and the first electrode is out of the preset range, that the type of the short circuit between the case and the first electrode is an internal short circuit of the case and the internal short circuit of the case is not eliminated.

The information processing apparatus can determine, on the basis that the potential difference between the case and the first electrode is within or out of a preset range, whether the short circuit between the case and the first electrode is eliminated and accurately select the internal short circuit of the case.

Based on the above solution, the system further includes:
a cleaning apparatus configured to clean an electrolyte solution on the case before the case and the second electrode are connected by shorting.

Based on the above solution, the cleaning apparatus includes:

a container for soaking the battery with the deionized water at the preset temperature, the organic solvent of the electrolyte solution, and the volatile alcohol substance, sequentially; and an ultrasonic emitter configured to emit ultrasonic waves to the battery while the battery is soaked.

Better cleaning can be achieved by introduction of ultrasonic waves.

The above description is only a summary of the technical solutions of the present application. In order to be able to understand the technical means of the present application more clearly, the technical means can be implemented according to the content of the specification. Furthermore, to make the above and other objectives, features and advantages of the present application more comprehensible, specific implementations of the present application are descried as follows.

DESCRIPTION OF DRAWINGS

Various other advantages and benefits will become apparent to those of ordinary skill in the art upon reading the following detailed description of the preferred embodiments. The drawings are for the purpose of illustrating the preferred embodiments only and are not intended to limit the scope of the present application. Also, the same components are denoted by the same reference numerals throughout the drawings. In the drawings:

FIG. 3 is a schematic diagram of shorting between batteries and corresponding second electrodes according to an embodiment of the present application.

FIG. 4 is a flowchart of a battery case short-circuit processing method according to an embodiment of the present application.

FIG. 7 is an effect diagram of a battery case short-circuit processing method according to an embodiment of the present application.

FIG. 8 is a schematic structural diagram of a battery case short-circuit processing system according to an embodiment of the present application.

DETAILED DESCRIPTION

Figure 1:
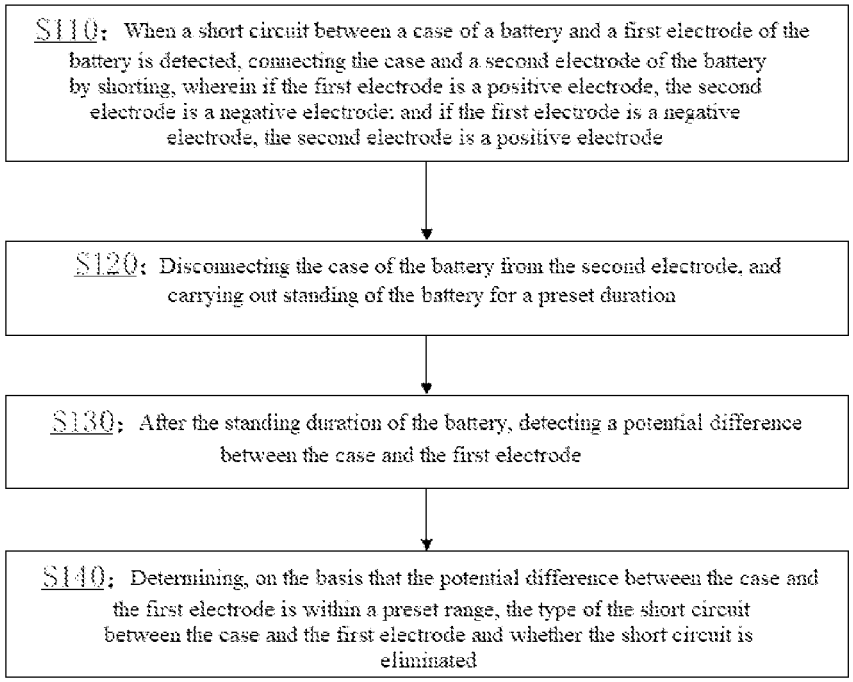
FIG. 1 is a flowchart of a battery case short-circuit processing method according to an embodiment of the present application.

Examples of the technical solutions of the present application will be described in detail below in conjunction with the accompanying drawings. The following embodiments are only used for illustrating the technical solutions of the present application more clearly, and are therefore only used as examples, and cannot be used for limiting the protection scope of the present application.

Unless otherwise defined, all technical and scientific terms used herein have the same meaning as commonly understood by those skilled in the art to which the present application belongs; the terms used herein are for the purpose of describing specific examples only, and are not intended to limit the present application; the terms "including" and "having" and any variations thereof in the description and claims of the present application as well as in the above description of drawings are intended to cover a non-exclusive inclusion.

In the description of the examples of the present application, the technical terms "first", "second", and the like are only used to distinguish between different objects, and are not to be understood as indicating or implying a relative importance or implicitly specifying a number, a particular order, or a primary and secondary relation of the technical features indicated. In the description of the embodiments of the present application, the meaning of "a plurality of" is two or more, unless otherwise explicitly and specifically defined.

Reference herein to "an example" means that a particular feature, structure, or characteristic described in connection with the example can be included in at least one example of the present application. The appearance of this phrase in various places in the specification does not necessarily refer to the same example, nor is it a separate or alternative example that is mutually exclusive with other examples. It is explicitly and implicitly understood by those skilled in the art that the examples described herein may be combined with other examples.

In the description of the examples of the present application, the term "and/or" is only an association relationship for describing associated objects, indicating that three relationships may exist. For example, A and/or B indicates that there are three cases of A alone, A and B together, and B alone. In addition, the character "/" herein generally means that associated objects before and after it are in an "or" relationship.

In the description of the embodiments of the present application, the term "a plurality of" refers to two or more (including two), similarly, "a plurality of groups" refers to two or more groups (including two groups), and "a plurality of pieces" refers to of two or more pieces (including two pieces).

In the description of the embodiments of the present application, orientations or positional relationships indicated by technical terms such as "center," "longitudinal," "lateral," "length," "width," "thickness," "upper," "lower," "front," "rear," "left," "right," "vertical" "horizontal," "top," "bottom," "inside," "outside," "clockwise," "counterclockwise," "axial," "radial," and "circumferential" are based on orientations or positional relationships shown in the accompanying drawings, are only for the convenience of describing the embodiments of the present application and simplifying the description, rather than indicating or implying that the indicated apparatus or element must have a specific orientation or be constructed and operated in a specific orientation, and therefore cannot be understood as limitation to the embodiments of the present application.

In the description of the embodiments of the present application, unless otherwise expressly specified and limited, technical terms such as "installation," "connected," "connection," and "fixed" should be understood in a broad sense, for example, it may be a fixed connection, a detachable connection, or an integral connection; it may also be a mechanical connection or an electrical connection; it may be a direct connection or an indirect connection through an intermediate medium, and it may be an internal communication between two elements or an interaction relationship between the two elements. Those of ordinary skill in the art can understand specific meanings of the above terms in the embodiments of the present application according to specific situations.

At present, there may be a short circuit between a case and a negative electrode or a positive electrode, and it is difficult to repair the short circuit between the case and the positive electrode or negative electrode of a battery, and after a period of repairing, the case and the positive electrode or negative electrode of the battery will be short circuited again.

It has been found through research that if there is residual electrolyte solution or metal particles between the case and a terminal post of the battery, there will be an external short circuit of the case between the case of the battery and the corresponding electrode, and the external short circuit of the case will decrease a potential difference of the case relative to the positive electrode or relative to the negative electrode. If a part of the internal structure of the case of the battery is damaged, there will be an internal short circuit of the case between the case and the positive electrode or the negative electrode of the battery.

For the external short circuit of the case, if there is a short circuit between the case and the negative electrode, the case and the positive electrode may be connected by shorting, and the positive electrode is discharged to the case through the shorting, so that the potential difference of the case relative to the negative electrode is increased. If there is a short circuit between the case and the positive electrode, the case and the negative electrode may be connected by shorting, and the case is discharged to the negative electrode through the shorting, so that the potential difference of the positive electrode relative to the case is increased, thereby returning the potential difference of the case relative to the positive electrode or the negative electrode to normal.

After the potential difference of the case relative to the positive electrode or the negative electrode returns to normal, and the battery is subjected to standing for a period of time, if the type of short circuit of the case is an internal short circuit of the case, the short circuit of the case cannot be repaired after the shorting, discharging due to the internal short circuit of the case during the standing duration will make the potential difference of the case relative to the positive or negative electrode abnormal again. In this way, by measuring the potential difference after the standing, a battery that has been repaired by the shorting as well as a battery that cannot be repaired due to an internal short circuit of the case can be selected.

The battery disclosed in the embodiments of the present application can be used, but not limited to, in powered devices such as a vehicle, a ship, or an aircraft. An embodiment of the present application provides a powered device using the battery as a power supply. The powered device may be, but not limited to, a mobile phone, a tablet, a laptop computer, an electric toy, an electric tool, a battery car, an electric vehicle, a ship, a spacecraft, or the like. The electric toy may include fixed or mobile electric toys, such as game consoles, electric car toys, electric ship toys, electric airplane toys, and the like. The spacecraft may include airplanes, rockets, space shuttles, spaceships, and the like.

The term "shorting" involved in the embodiments of the present application can be understood as an electrical connection, for example, a second electrode and the case are connected by a flexible wire or a metal wire to form a discharge connection between the second electrode and the case.

The term "standing" involved in the embodiments of the present application can be understood as placing at a room temperature (or referred to as a normal temperature).

The term "organic solvent of an electrolyte solution" involved in the embodiments of the present disclosure can be understood as a solvent composed of any organic substance capable of dissolving the electrolyte solution.

The term "volatile alcohol substance" involved in the embodiments of the present disclosure can be understood as various alcohol reagents with hydroxyl groups.

As shown in FIG. 1, an embodiment of the present application provides a battery case short-circuit processing method, which includes:

S110: when a short circuit between a case of a battery and a first electrode of the battery is detected, connecting the case and a second electrode of the battery by shorting, wherein if the first electrode is a positive electrode, the second electrode is a negative electrode; and if the first electrode is a negative electrode, the second electrode is a positive electrode;

S120: disconnecting the case of the battery from the second electrode, and carrying out standing of the battery for a preset duration;

S130: after the standing duration of the battery, detecting a potential difference between the case and the first electrode; and S140: determining, on the basis that the potential difference between the case and the first electrode is within a preset range, the type of the short circuit between the case and the first electrode and whether the short circuit is eliminated.

The battery may be a power battery such as a lithium battery or a sodium battery.

Figure 2:
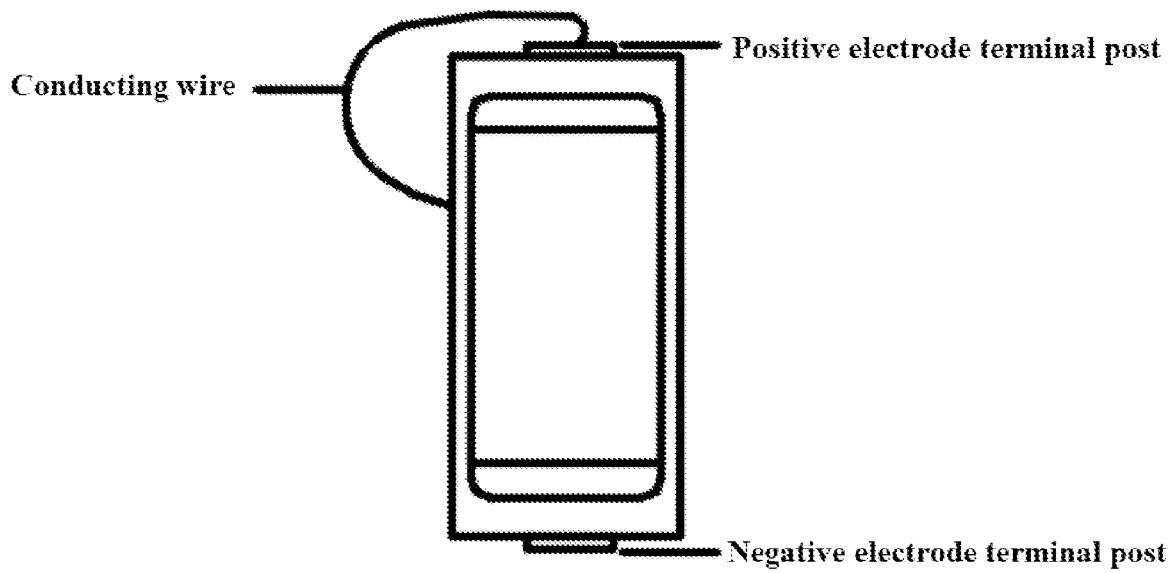
FIG. 2 is a schematic structural diagram of a battery according to an embodiment of the present application.

Referring to FIG. 2, the battery may include: a case, a positive electrode terminal post, a positive electrode sheet, a negative electrode terminal post, a negative electrode sheet, and the like. The positive electrode terminal post and the negative electrode terminal post can be collectively referred to as terminal posts, which will be exposed to the outside of the battery through openings on the case. The positive electrode terminal post is electrically connected to the positive electrode sheet; and the negative electrode sheet is electrically connected to the negative electrode terminal post.

Generally, the case may be a metal case or an alloy case. Illustratively, the case may be an aluminum case. That is, the case itself is also a conductor.

If the case and the positive electrode are short-circuited, the case will leak electricity externally. If the negative electrode and the case are short-circuited, a discharge capacity of the battery will be reduced, and the case will be corroded and perforated, thereby affecting the safety of the battery.

If there is no short circuit between the case and the battery, a potential of the positive electrode is greater than that of the case; and a potential of the case is greater than that of the negative electrode. Moreover, a potential difference between the positive electrode and the case is required to be greater than a preset value, a potential difference between the case and the negative electrode is also required to be greater than the preset value, then the insulation between the case and the positive electrode or the negative electrode is good enough.

Therefore, a detection apparatus is used to detect the potential difference between the case and the positive or negative electrode of the battery. It is determined whether there is a short circuit between the case and the positive or negative electrode of the battery according to whether the potential difference is within the preset range.

If it is detected that the case of the battery is short-circuited with the first electrode, the second electrode of the battery is short-circuited with the case, so that ions (e.g., lithium ions or sodium ions) on the case are deintercalated from the case, reducing the short circuit caused by contact between the ions accumulated on the case and the positive or negative electrode.

The short circuit between the case of the battery and the positive or negative electrode is divided into an internal short circuit of the case and an external short circuit of the case.

FIG. 2 shows a short circuit between the negative electrode and the case, where the positive electrode and the case are connected by shorting.

Most of the reasons for the external short circuit of the case are that a surface of the case is contaminated by an electrolyte solution or metal, resulting in a short circuit between the outside of the case and the positive or negative electrode of the battery. In this way, the case of the battery can be repaired by delithiation of ions from the case.

The internal short circuit of the case occurs inside the case. It is relatively difficult to repair the case by removing ions or metals on the surface of the case of the battery.

If the short circuit type is an internal short circuit of the case, the potential difference of the case relative to the first electrode can be restored to a normal value after the second electrode and the case are connected by shorting for a period of time. However, after standing for a period of time, the internal short circuit of the case is not actually eliminated, and the potential difference of the case relative to the first electrode will return to an abnormal value again within the standing duration of the battery.

Therefore, in the embodiment of the present application, after the case and the second electrode are disconnected, the battery needs to be subjected to standing for a preset duration, so that the unrepairable internal short circuit of the case makes the potential difference of the case relative to the first electrode return to an abnormal value again. The abnormal value may be any value within the preset range.

In this way, after the battery is subjected to standing for a period of time, the potential difference between the first electrode and the case of the battery is measured. If the potential difference is normal (e.g., within the preset range), it means that the short circuit between the first electrode and the case has been eliminated, and the type of the short circuit between the case and the first electrode that can be eliminated is an external short circuit of the case. If the measured potential difference is abnormal, it means that the short circuit between the first electrode and the case has not been eliminated, and there is a high probability that the type of the short circuit between the case and the first electrode is an internal short circuit of case.

The external short circuit of the case can be considered a repairable case abnormality, while the internal short circuit of the case can be considered as an unrepairable case abnormality.

Typical external shorts of the case may include:
a short circuit between the electrolyte solution and the positive or negative electrode of the battery externally caused by that the case is contaminated by the electrolyte solution;
an overlapping between a terminal post and the case; and
an overlapping between the case and a probe that is configured to charge and discharge and arranged on the surface of the battery.

Typical internal shorts of the case may include:
an overlapping between an electrode tab and the case, where the electrode tab is located inside the case, and the electrode tab is a part of an electrode sheet and is a connection structure between the electrode sheet and the terminal post;
an overlapping between a current collector and the case, where the current collector is a part of the electrode sheet, the electrode sheet includes the current collector, the current collector is provided with an active material, and a part of the current collector that is not coated with the active material may form the electrode tab; the active material contains lithium ion and sodium ion and the like, which may realize the charging and discharging of the battery through migration of ions;
breakage of a separator, where the separator is located between the positive electrode sheet and the negative electrode sheet to isolate the positive electrode sheet and the negative electrode sheet;
breakage of an insulating film (e.g., mylar); and
an abnormal resistance value of an insulating member near an opening of the case of the battery case. A terminal post can protrude from the opening. With the arrangement of the insulating member, the terminal post and the case are insulated from each other. However, if the resistance value of the insulating member is too small, it will cause a short circuit between the electrode and the case. This short circuit occurs inside the case. The opening will be covered with an end cap outside a main body portion of the case, that is, the insulating member is located inside the end cap.

In S110, that connecting the case and the first electrode by shorting may include: connecting a terminal post of the first electrode and the case by a conducting wire. Exemplarily, an inducer is used to be in contact with the case and the terminal post of the first electrode, respectively, so as to realize a shorting through the contact between conductors.

In some embodiments, if the type of short circuit is an internal short circuit of the case, the battery will be scrapped in order to ensure its safety. In order to reduce unnecessary scrapping, for a battery of which the type of short circuit is determined as a an internal short circuit of the case according to a processing result obtained by executing the above-mentioned case short-circuit processing method once, it is necessary to repeat the above-mentioned case short-circuit processing method one or more times so as to avoid unnecessary scrapping of the battery caused by misjudgment of one determination result of the internal short circuit of the case.

Therefore, in the embodiment of the present disclosure, with the shorting between the second electrode and the case of the battery, the standing of the battery, and the measurement of the potential difference between the case and the first electrode, it is easy to obtain the type of the short circuit between the case and the first electrode and to eliminate the external short circuit of the case.

Referring to FIG. 3, when repairing a short circuit between the first electrode and the case, repairing in batch can be performed on a plurality of batteries having short circuits between cases and first electrodes.

Exemplarily, S140 may include:
when the potential difference between the case and the first electrode is within the preset range, determining that the type of the short circuit between the case and the first electrode is an external short circuit of the case, and the external short circuit of the case is eliminated.

Different active materials of the batteries lead to different preset ranges. For example, taking a lithium battery as an example for description, for a ternary polymer lithium battery, the preset range may be a range greater than or equal to a preset value. The preset value may be 2V or any value within a specific range with 2V as a median value.

For a lithium iron phosphate battery, the preset range may be a range greater than or equal to a preset value, and the preset value may be a value range with 1.5V as a median value. Exemplarily, the value range of the preset value may be between 1V and 3.5V.

When the first electrode is a positive or negative electrode, the preset value defining the preset range may be the same or different.

Exemplarily, when the first electrode is a positive electrode or a negative electrode, the preset value for the negative electrode may be slightly greater than the preset value for the positive electrode.

Exemplarily, for the ternary polymer lithium battery, if a voltage between the negative electrode and the case is less than 1.5V, it can be considered that there is a short circuit between the negative electrode and the case, and if a voltage between the positive electrode and the case is less than 1V, it can be considered that there is a short circuit between the positive electrode and the case. If the voltage between the negative electrode and the case is greater than or equal to 1.5V, it can be considered that there is no short circuit between the negative electrode and the case; and if the voltage between the positive electrode and the case is greater than or equal to 1V, it can be considered that there is no short circuit between the positive electrode and the case.

Further exemplarily, for the lithium iron phosphate battery, if a voltage between the negative electrode and the case is less than 2V, it can be considered that there is a short circuit between the negative electrode and the case, and if a voltage between the positive electrode and the case is less than 1.5V, it can be considered that there is a short circuit between the positive electrode and the case. If the voltage between the negative electrode and the case is greater than or equal to 2V, it can be considered that there is no short circuit between the negative electrode and the case; and if the voltage between the positive electrode and the case is greater than or equal to 1.5V, it can be considered that there is no short circuit between the positive electrode and the case. Of course, the above are just examples.

By the shorting, standing and re-measurement, it is found that the potential difference between the case and the first electrode is within the preset range, indicating that the potential difference between the case and the first electrode has returned to normal. Accordingly, it can be considered that the short circuit between the case and the first electrode has been repaired and the type of short circuit is an external short circuit of the case.

In another embodiment, S140 may include: when the potential difference between the case and the first electrode is out of the preset range, determining that the type of the short circuit between the case and the first electrode is an internal short circuit of the case, and the internal short circuit of the case is not eliminated.

At the beginning of the shorting, the potential difference between the case and the first electrode is restored to the normal value. After standing for a period of time, if the short circuit between the case and the first electrode is an internal short circuit of the case, then a loop formed by the internal short circuit of the case will make the potential difference between the case and the first electrode abnormal again. Therefore, the potential difference measured at this time is out of the preset range, then it can be considered that the short circuit between the case and the first electrode has not been eliminated. Moreover, the type of the short circuit between the case and the first electrode is an unrepairable internal short circuit of the case.

In some embodiments, as shown in FIG. 4, the method further includes:

S100: cleaning an electrolyte solution on the case before connecting the case and the second electrode by shorting.

In this way, a circumstance that the case and the first or second electrode of the battery are short-circuited again due to moving of the electrolyte solution remaining on the case after the external short circuit of the case is eliminated is reduced, thereby eliminating the external short circuit of the case more completely.

In the embodiment of the present disclosure, before connecting the case and the first electrode by shorting, the electrolyte solution on the case is first cleaned; and by cleaning the electrolyte solution on the outer surface of the case, on the one hand, a duration required for eliminating abnormality by means of shorting can be reduced, and on the other hand, the abnormality caused by the external short circuit of the case can be eliminated more completely.

Here, cleaning an electrolyte solution on the case before connecting the case and the second electrode by shorting may at least include:

cleaning the electrolyte solution between the case and a terminal post of the first electrode before connecting the case and the second electrode by shorting.

In this way, when using various solutions to clean the electrolyte solution on the case, at least the terminal post of the first electrode and the case near the terminal post of the first electrode need to be soaked in the corresponding solvent. For example, it is at least necessary to soak the terminal post of the first electrode and part of the case in deionized water, an organic solution of the electrolyte solution and a volatile alcohol substance.

Figure 5:
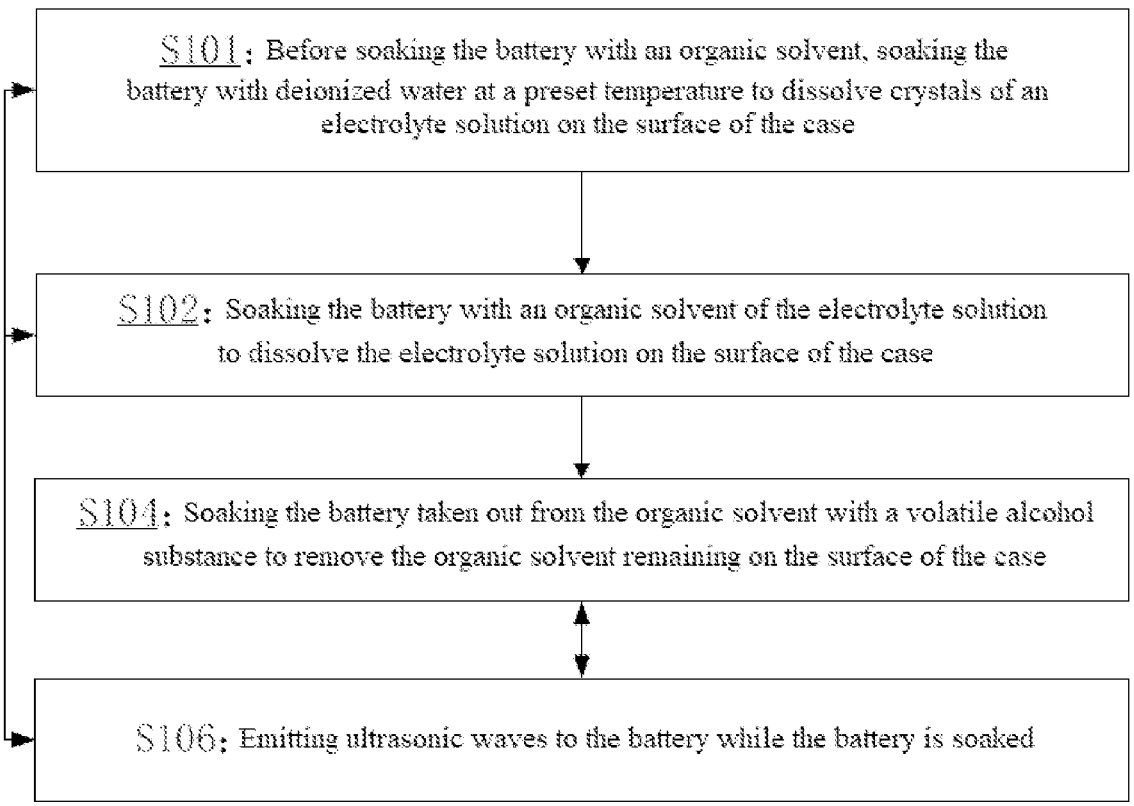
FIG. 5 is a flowchart of cleaning an electrolyte solution on a surface of a case according to an embodiment of the present application.

As shown in FIG. 5, S100 may include:

S102: soaking the battery with an organic solvent of the electrolyte solution to dissolve the electrolyte solution on the surface of the case; and S104: soaking the battery taken out from the organic solvent with a volatile alcohol substance to remove the organic solvent remaining on the surface of the case.

In an embodiment, the organic solvent of the electrolyte solution can be used to dissolve the electrolyte solution on the surface of the case of the battery, so as to realize cleaning of the electrolyte solution on the surface of the case. The battery can then be taken out from the organic solvent.

The organic solvent includes but is not limited to various carbonates.

In the embodiment of the present disclosure, in order to further reduce the short circuit between the case and the positive or negative electrode of the battery caused by the electrolyte solution dissolved by the organic solvent remaining on the case of the battery after the battery is taken out from the organic solvent, the organic solvent will be further dissolved by using the alcohol substance with high volatility, and the organic solvent will be quickly volatilized by using the high volatility of the alcohol substance.

By increasing concentrations of the alcohol substance, high volatility of the alcohol substance can be ensured. Therefore, by soaking the battery again with the alcohol substance, the electrolyte solution and/or metal substance on the surface of the case of the battery can be more thoroughly removed.

In some embodiments, a duration for soaking the battery in the organic solvent is a first duration;

and/or, a duration for soaking the battery in the alcohol substance is a second duration.

The first duration and the second duration may be the same or different.

Exemplarily, both the first duration and the second duration may range from 5 minutes to 30 minutes.

Preferably, both the first duration and the second duration may be 5 minutes, 10 minutes or 15 minutes, and a specific duration may be determined according to a volume of the battery and/or a shape of the case.

In an embodiment, as shown in FIG. 5, S100 further includes:

S101: before soaking the battery with the organic solvent, soaking the battery with deionized water at a preset temperature to dissolve crystals of the electrolyte solution on the surface of the case.

After the case is contaminated by the electrolyte solution, the electrolyte solution may crystallize in a relatively dry external environment. In order to better remove the crystals and reduce the abnormality caused by the unremoved crystals after the external short circuit of the case is repaired, the battery can be soaked in deionized water at a preset temperature first, so that the crystals on the case can be dissolved in the deionized water.

The deionized water has the characteristic of weak conductivity, thereby improving the safety in processing.

In an embodiment, a duration for soaking the battery in deionized water is a third duration.

The third duration may or may not be equal to the first duration and/or the second duration.

Exemplarily, a value range of the third duration may also range from 5 minutes to 30 minutes.

In an embodiment, the preset temperature is between 70° C. and 90° C.

The water temperature of the deionized water is set between 70° C. and 90° C., which can make the crystals of the electrolyte solution more fully dissolved in the deionized water at an extremely high temperature.

Preferably, the preset temperature may be between 75° C. and 85° C., and further preferably, the preset temperature may be between 80° C. and 85° C.

In some embodiments, S100 further includes:

S106: emitting ultrasonic waves to the battery while the battery is soaked.

When the battery is soaked in the deionized water, organic solvent and alcohol substance in sequence, ultrasonic waves are emitted to the battery, and the crystals of electrolyte solution, electrolyte solution or metal particles on the surface of the case can be cleaned better by ultrasonic waves.

In an embodiment, the organic solvent includes at least one of the following:
dimethyl carbonate;
diethyl carbonate; and
dipropyl carbonate.

In another embodiment, the alcohol substance includes:
anhydrous ethanol and/or anhydrous methanol.

Of course, the above is only an example of the organic solvent and alcohol substance, and the specific implementation is not limited to this example.

Figure 6:
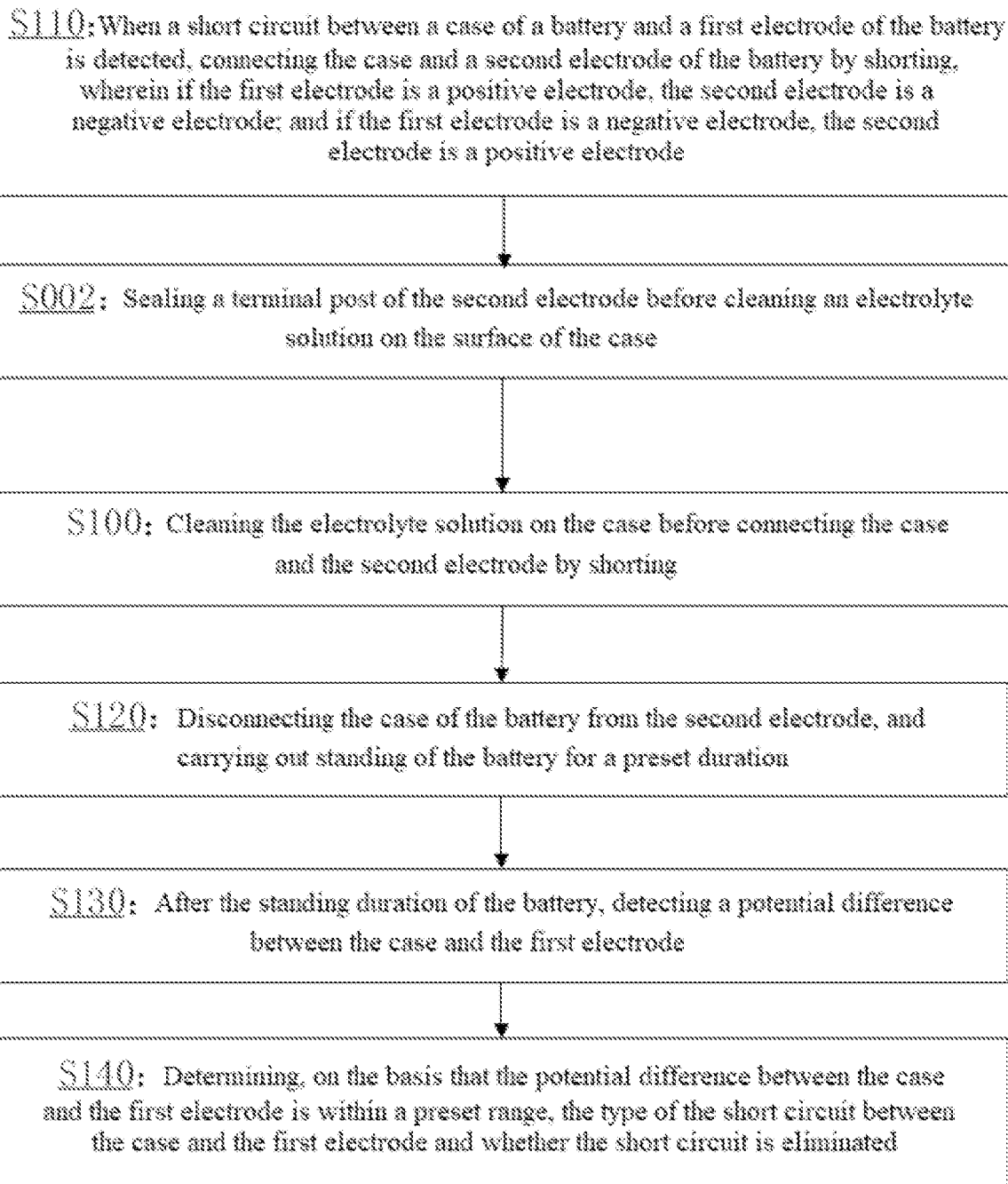
FIG. 6 is a flowchart of a battery case short-circuit processing method according to an embodiment of the present application.

In the embodiments of the present disclosure,

In some embodiments, as shown in FIG. 6, the battery case short-circuit processing method further includes:

S002: sealing a terminal post of the second electrode of the battery before cleaning the electrolyte solution on the surface of the case.

For example, the terminal post of the second electrode is wrapped with a waterproof tape or waterproof film, so as to prevent the terminal post of the second electrode from being oxidized when the battery is soaked in a liquid such as deionized water, thereby ensuring normal use of the battery after the external short circuit of the case is repaired.

In some embodiments, the method further includes:

S001: when it is detected that the potential difference between the case and the first electrode is out of the preset range, determining a short circuit between the case and the first electrode.

For example, by means of a voltmeter or the like, the potential difference between the case and the positive or negative electrode of the battery is measured, and whether a short circuit occurs between the case and the first electrode is determined according to the measured potential difference.

If the potential difference between the case and the first electrode is out of the preset range, it means that the potential difference between the case and the first electrode is abnormal, and there is a short circuit between the case and the first electrode. By the case short-circuit processing method provided in any of the foregoing technical solutions, the external short circuit of the case can be eliminated, or the internal short circuit of the case can be determined so that the battery is scraped to avoid the safety problem caused by the use of the battery.

After the short circuit between the case and the first electrode is detected, the above-mentioned S110 to S140 are performed at least once, so that the short circuit of the case can be eliminated.

In an embodiment, the preset duration for standing after the shorting between the second electrode and the case is cut off ranges from 6 hours to 54 hours.

Preferably, the preset duration may be 24 hours, 36 hours or 48 hours.

If the preset duration is 24 hours, 36 hours, or 48 hours, even a small internal short circuit between the case and the first electrode can be detected, so that an abnormal battery having the unrepairable internal short circuit of the case can be more accurately screened out.

FIG. 7 is a comparison diagram of effects before and after a short circuit between the negative electrode and the case of the battery is repaired using the case short-circuit processing method provided in an embodiment of the present application. A horizontal axis of FIG. 7 indicates the date and time axis, and a longitudinal axis indicates the potential difference between the negative electrode and the case.

As shown in FIG. 8, an embodiment of the present disclosure provides a battery case short-circuit processing method, which includes:

shorting member 110 configured to, when a short circuit between a case of a battery and a first electrode of the battery is detected, connect the case and a second electrode of the battery by shorting, wherein if the first electrode is a positive electrode, the second electrode is a negative electrode; and if the first electrode is a negative electrode, the second electrode is a positive electrode;

detection apparatus 120 configured to detect a potential difference between the case and the first electrode after the case and the first electrode are disconnected and the battery is subjected to standing for the preset duration; and information processing apparatus 130 configured to determine, on the basis that the potential difference between the case and the first electrode is within a preset range, the type of the short circuit between the case and the first electrode and whether the short circuit is eliminated.

Shorting member 110 includes but is not limited to at least one of the following:

a short cord, having connection terminals, with both ends being in contact with the case and a terminal post of the first electrode respectively, so as to realize a shorting between the case and the first electrode; and an inducer, respectively in contact with the case and the first electrode, so as to realize the shorting between the case and the first electrode by the contact between conductors.

Detection apparatus 120 includes, but is not limited to, an electronic instrument such as a voltmeter that can measure the potential difference between the first electrode and the case.

Information processing apparatus 130 includes, but is not limited to, a desktop computer, a laptop, or a microprocessor or an intercalated controller integrated with detection apparatus 120.

In an embodiment, information processing apparatus 130 may be disposed apart from detection apparatus 120. In another embodiment, information processing apparatus 130 may also be electrically connected to detection apparatus 120, so that the information processing apparatus can determine whether the short circuit between the case and the first electrode is repaired according to the potential difference detected by detection apparatus 120, and when the short circuit between the case and the first electrode is not repaired, determine that the type of short circuit is an unrepairable internal short circuit of the case.

By using the above-mentioned case short-circuit processing system, the external short circuit of the case of the battery can be repaired as simply as possible, while the internal short circuit of the case can be eliminated, thereby ensuring a yield rate of the battery put into use from the factory and ensuring the safety of the battery in use.

In some embodiments, information processing apparatus 130 is specifically configured to determine, when the potential difference between the case and the first electrode is within the preset range, that the type of the short circuit between the case and the first electrode is an external short circuit of the case and the external short circuit of the case is eliminated.

In some other embodiments, information processing apparatus 130 is specifically configured to determine, when the potential difference between the case and the first electrode is out of the preset range, that the type of the short circuit between the case and the first electrode is an internal short circuit of the case and the external short circuit of the case is not eliminated.

In some embodiments, the system further includes:
  a cleaning apparatus configured to clean an electrolyte solution on the case before the case and the second electrode are connected by shorting.

The cleaning apparatus is configured to clean the electrolyte solution on the case before the case and the second electrode are connected by shorting, thereby reducing re-short circuit between the case and the first electrode of the battery caused by the residual electrolyte solution on the surface of the case after the battery is repaired by the shorting between the case and the second electrode.

In some embodiments, the cleaning apparatus includes:
  a container for soaking the battery with deionized water at a preset temperature, an organic solvent of the electrolyte solution, and a volatile alcohol substance, sequentially; and
  an ultrasonic emitter configured to emit ultrasonic waves to the battery while the battery is soaked.

The container is configured to contain a substance such as the deionized water, the organic solvent of the electrolyte solution, and the volatile alcohol substance. Then a battery needing short circuits of the case is soaked in the container containing the above substance.

The ultrasonic transmitter can emit ultrasonic waves. When the battery is soaked in the liquid in the container, it emits ultrasonic waves to the battery, so that the surface of the battery case is better cleaned by vibration caused by the ultrasonic waves.

Of course, in some embodiments, the system further includes:
  a sealing apparatus configured to coat and seal a terminal post of the second electrode before cleaning the battery.

The sealing apparatus may include a mechanical arm for wrapping a waterproof adhesive tape on the terminal post of the second electrode, or a glue application device for coating the surface of the terminal post of the second electrode with a waterproof glue layer, and the like.

Of course, this is only an example of the sealing apparatus, and the specific implementation is not limited to this example.

The following takes a lithium battery as an example to illustrate:
  the lithium-ion battery industry is developing rapidly, especially power batteries are getting more attention. The first-generation sodium-ion battery released by CATL has received widespread attention, marking a huge leap from laboratory research to large-scale commercial application of sodium-ion batteries. There may be a short circuit between negative electrodes and cases during the production and testing of aluminum-shell lithium-ion batteries or sodium-ion batteries. According to short-circuit positions, it may be divided into: an internal short circuit of the case (referred to as an internal short circuit) and an external short circuit of the case (referred to as an external short circuit).

The reasons for the internal short circuit of the case include but are not limited to:
  an overlapping of a negative electrode tab, an overlapping of a current collector, breakage of a separator/Mylar film, and abnormal resistance value of a plastic part of the end cap.

The reasons for the external short circuit of the case include but are not limited to: contamination of the electrolyte solution to the negative electrode terminal post, and an overlapping of a metal/probe of the negative electrode terminal post.

When the negative electrode and the case are short-circuited, a primary battery composed of an aluminum shell and the negative electrode will form a complete closed loop. In the primary battery, the aluminum shell is used as a positive electrode, and a negative electrode sheet is used as a negative electrode. Lithium ions in the electrolyte solution will be continuously intercalated in the aluminum shell to form $Li_xAl$ (lithium aluminum alloy, i.e., a corrosion product). Then, an electrode potential of the aluminum shell decreases rapidly, and a potential difference between the aluminum shell and the negative electrode will be greatly reduced.

The $Li_xAl$ compound has a loose structure, and the aluminum shell will be corroded and perforated when the reaction is carried out for a long time.

The technical problem to be solved by the present disclosure is to screen and distinguish the internal short circuit and the external short circuit between the negative electrode and the case of the battery, and to repair internal corrosion of the battery case caused by the short circuit between the negative electrode and the case.

An embodiment of the present application provides a self-repairing method for internal corrosion of a case of a battery.

In the method, a potential difference test is carried out between the negative electrode and the case to determine a bad product. For example, if the measured potential difference between the negative electrode and the case is less than V0, the battery is considered to be a bad product. A value range of V0 may be between 1V and 3.5V.

For the bad product, a positive electrode terminal post of the battery and the case are connected by shorting through a conducting wire for a period of time, so that Li intercalated in the aluminum shell can be deintercalated to achieve the purpose of repairing. The repaired battery is allowed to be subjected to standing at a room temperature for a period of time, and then the potential difference between the negative electrode and the case is remeasured.

If the re-measured potential difference is greater than or equal to the V0, it is a repaired battery.

If the potential difference of the re-measurement is less than V0, it is an unrepairable battery, and there is an internal short circuit between the negative electrode and the case of this battery.

This method can simply and quickly distinguish the internal short circuit as well as the external short circuit between the negative electrode and the case, so as to reduce safety accidents caused by the use of the battery, having the internal short circuit between the negative electrode and the case, on the client side.

By the method, the internal corrosion of the battery case caused by the external short circuit between the negative electrode and the case can be repaired easily and quickly, without additional repairing device. Bad product error scrap in a negative electrode-to-case voltage test due to the external short circuit (temporary external short circuit caused by the electrolyte solution, metal, or the like) between the negative electrode and the case can be reduced, thereby increasing battery manufacturing yield and saving costs.

Before repairing the battery by a shorting between the positive electrode and the case of the battery, a negative electrode terminal post is cleaned by ultrasonic cleaning with hot water, Diethyl Carbonate (DEC), and absolute ethanol, respectively.

After the repairing, the battery is subjected to standing at a room temperature to screen out and distinguish the internal short circuit as well as the external short circuit between the negative electrode and the case.

The method is also adaptable to both an aluminum-shell lithium-ion battery and a sodium-ion battery, and the above is only an example of using the lithium battery.

By the method, the internal corrosion of the battery case caused by the external short circuit between the negative electrode and the case can be repaired easily and rapidly, and Li or Na ions in the LixAl compound that has been produced on the aluminum shell can be deintercalated, thereby restoring the potential difference between the negative electrode and the case to normal.

For the battery with an external short circuit between the negative electrode and the case caused by contamination of the electrolyte solution, ultrasonic cleaning with hot water, DEC, and anhydrous ethanol respectively before the repairing can be carried out to effectively remove the residual electrolyte solution and prevent the residual electrolyte solution from absorbing water to reconnect the negative electrode terminal post and case in the subsequent use.

This method can simply and quickly distinguish the internal short circuit as well as the external short circuit between the negative electrode and the case, so as to reduce safety accidents caused by the use of the battery, having the internal short circuit between the negative electrode and the case, on the client side.

The embodiment provides a self-repairing method for internal corrosion of a case of a battery. First, a positive electrode terminal post is sealed with an insulating and waterproof adhesive tape, and then a negative electrode terminal post is soaked in hot water (30-85° C. deionized water), DEC, and absolute ethyl alcohol to be subjected to ultrasonic cleaning for 5 to 60 minutes, then it is taken out to dry.

After cleaning, the insulating and waterproof adhesive tape of the positive electrode terminal post is removed, and then the positive electrode terminal post and the case of the battery are connected through a conductor (a copper conductor or aluminum conductor or other metal conductor).

The conducting wire is removed after 0.2-24 hours of repairing. After the positive electrode and the case are connected through the conducting wire, the battery with the positive electrode and the case being connected through the conducting wire is allowed for standing in a normal temperature environment. The normal temperature may be 25° C. plus or minus a preset degree Celsius.

The repaired battery is subjected to standing at a room temperature for 1 to 48 hours;

Then a negative electrode-to-case voltage is measured, a battery whose potential difference is less than the specified value V0 is eliminated, and the rest battery is a repaired battery.

The principle of cleaning the electrolyte solution of the lithium battery may be as follows:

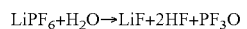

The organic solvent such as DEC can be used for dissolving the residual electrolyte solution and additives, and the volatile alcohols substance such as alcohol mainly dissolves and clean the residual DEC on the negative electrode terminal post.

Self-Repairing Mechanism

After the positive electrode terminal post and the case are connected through a conducting wire, a primary battery composed of the positive electrode terminal post and the case forms a closed loop, that is, the primary battery composed of the positive electrode terminal post/case is discharged:

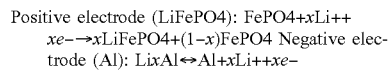

The Li previously intercalated in the aluminum shell is deintercalated, and the electrode potential of the aluminum shell increases, that is, the potential difference between the positive electrode and the case decreases. The reasons are as follows: a potential difference between the positive and negative electrodes is the potential difference between the positive electrode and the case plus the potential difference between the case and the negative electrode. Therefore, when the potential of the case increases, the potential difference between the case and the negative electrode increases. In this way, after a period of repairing, the potential difference between the case and the negative electrode will return to the normal value.

Further, the positive electrode terminal post and the case may be connected using a conducting wire as shown in FIG. 2. Or a self-designed device for repairing in batches is used as shown in FIG. 3, where a probe will be in contact with the positive electrode terminal post and the case respectively, and the positive electrode terminal post will be connected to the case through an internal circuit.

The negative electrode of a bad lithium-ion battery obtained in a voltage test during testing the potential difference between the negative electrode and the case is soaked into 80° C. hot water, DEC, and absolute ethanol for ultrasonic cleaning for 15 minutes respectively, and then it is taken out to dry.

The positive electrode and the case of the cleaned battery are connected through a copper conductor, and then the conducting wire is removed after repairing is carried out at a room temperature for 2 hours.

After the repairing, the potential difference between the negative electrode and the case is measured, and the negative electrode-to-case voltage is measured again after standing at room temperature for 48 hours.

If the voltage measured again is less than the specified value V0, the battery will be eliminated, and the rest batteries are repaired batteries.

The potential difference between the negative electrode and the case is tested for determining bad products (less than a specified value V1, and the specified values of the negative electrode-to-case voltage of different types of batteries are different).

The negative electrode of the sodium ion battery is soaked in hot water at 80° C., DEC, and absolute ethanol for ultrasonic cleaning for 15 min respectively, and then it is taken out to dry.

The positive electrode and the case of the cleaned battery are connected through a copper conductor, and then the conducting wire is removed after repairing is carried out at a room temperature for 2 hours.

After the repairing, the potential difference between the negative electrode and the case is measured, standing is carried out at a room temperature for 48 hours, and then the negative electrode-to-case voltage is measured again. If the voltage measured again is less than the specified value V0, the battery is eliminated, and the rest batteries are repaired batteries.

Finally, it should be noted that the above embodiments are merely used for illustrating rather than limiting the technical solutions of the present application. Although the present application has been described in detail with reference to the above various embodiments, those of ordinary skill in the art should understood that the technical solutions specified in the above various embodiments can still be modified, or some or all of the technical features therein can be equivalently substituted; and such modifications or substitutions do not make the essence of the corresponding technical solutions depart from the scope of the technical solutions of the various embodiments of the present application, and shall fall within the scope of the claims of the specification of the present application. In particular, the various technical features mentioned in the various examples can be combined in any way as long as there are no structural conflicts. The present application is not limited to the specific embodiments disclosed herein, but rather includes all technical solutions falling within the scope of the claims.

The invention claimed is:

1. A battery case short-circuit processing method, comprising:
    when a short circuit between a case of a battery and a first electrode of the battery is detected, connecting the case and a second electrode of the battery by shorting, wherein if the first electrode is a positive electrode, the second electrode is a negative electrode; and if the first electrode is a negative electrode, the second electrode is a positive electrode;
    disconnecting the case of the battery from the second electrode, and carrying out standing of the battery for a preset duration;
    after a standing duration of the battery, detecting a potential difference between the case and the first electrode; and
    determining, on a basis that the potential difference between the case and the first electrode is within a preset range, a type of the short circuit between the case and the first electrode and whether the short circuit is eliminated.

2. The method according to claim 1, wherein the determining, on a basis that the potential difference between the case and the first electrode is within a preset range, the type of the short circuit between the case and the first electrode d whether the short circuit is eliminated comprises:
    when the potential difference between the case and the first electrode is within the preset range, determining that the type of the short circuit between the case and the first electrode is an external short circuit of the case, and the external short circuit of the case is eliminated.

3. The method according to claim 1, wherein the determining, on a basis that the potential difference between the case and the first electrode is within a preset range, the type of the short circuit between the case and the first electrode and whether the short circuit is eliminated comprises:
    when the potential difference between the case and the first electrode is out of the preset range, determining that the type of the short circuit between the case and the first electrode is an internal short circuit of the case, and the internal short circuit of the case is not eliminated.

4. The method according to claim 1, wherein the method further comprises:
    cleaning an electrolyte solution on the case before connecting the case and the second electrode by shorting.

5. The method according to claim 4, characterized in that the cleaning an electrolyte solution on the case before connecting the case and the second electrode by shorting comprises:
    soaking the battery with an organic solvent of the electrolyte solution to dissolve the electrolyte solution on a surface of the case; and
    soaking the battery taken out from the organic solvent with a volatile alcohol substance to remove the organic solvent remaining on the surface of the case.

6. The method according to claim 5, a duration for soaking the battery in the organic solvent is a first duration; and/or
    a duration for soaking the battery in the alcohol substance is a second duration.

7. The method according to claim 5, wherein the cleaning an electrolyte solution on the case before connecting the case and the second electrode by shorting comprises:
    before soaking the battery with the organic solvent, soaking the battery with deionized water at a preset temperature to dissolve crystals of the electrolyte solution on the surface of the case.

8. The method according to claim 7, wherein a duration for soaking the battery in the deionized water is a third duration.

9. The method according to claim 7, wherein the preset temperature is between 70° C. and 90° C.

10. The method according to claim 4, wherein the cleaning an electrolyte solution on the case before connecting the case and the second electrode by shorting comprises:
    emitting ultrasonic waves to the battery while the battery is soaked.

11. The method according to claim 4, wherein the organic solvent comprises at least one of the following:

dimethyl carbonate;
diethyl carbonate;
dipropyl carbonate;
and/or
the alcohol substance comprises:
anhydrous ethanol and/or anhydrous methanol.

12. The method according to claim 4, wherein the method further comprises:
sealing a terminal post of the second electrode before cleaning the electrolyte solution on the surface of the case.

13. The method according to claim 1, wherein the method further comprises:
when it is detected that the potential difference between the case and the first electrode is out of the preset range, determining that there is a short circuit between the case and the first electrode.

14. The method according to claim 1, wherein the preset duration ranges from 6 to 54 hours.

15. A battery case short-circuit processing system, comprising:
a shorting member configured to, when a short circuit between a case of a battery and a first electrode of the battery is detected, connect the case and a second electrode of the battery by shorting, wherein if the first electrode is a positive electrode, the second electrode is a negative electrode; and if the first electrode is a negative electrode, the second electrode is a positive electrode;
a detection apparatus configured to detect a potential difference between the case and the first electrode after the case and the first electrode are disconnected and the battery is subjected to standing for a preset duration; and
an information processing apparatus configured to determine, on a basis that the potential difference between the case and the first electrode is within a preset range, a type of the short circuit between the case and the first electrode and whether the short circuit is eliminated.

16. The system according to claim 15, characterized in that the information processing apparatus is specifically configured to determine, when the potential difference between the case and the first electrode is within the preset range, that the type of the short circuit between the case and the first electrode is an external short circuit of the case and the external short circuit of the case is eliminated.

17. The system according to claim 15, wherein the information processing apparatus is further configured to determine, when the potential difference between the case and the first electrode is out of the preset range, that the type of the short circuit between the case and the first electrode is an internal short circuit of the case and the internal short circuit of the case is not eliminated.

18. The system according to claim 14, wherein the system further comprises:
a cleaning apparatus configured to clean an electrolyte solution on the case before the case and the second electrode are connected by shorting.

19. The system according to claim 18, wherein the cleaning apparatus comprises:
a container for soaking the battery with deionized water at a preset temperature, an organic solvent of the electrolyte solution, and a volatile alcohol substance, sequentially; and
an ultrasonic emitter configured to emit ultrasonic waves to the battery while the battery is soaked.

* * * * *